(12) United States Patent
Bae

(10) Patent No.: US 7,132,792 B2
(45) Date of Patent: Nov. 7, 2006

(54) ORGANIC ELECTROLUMINESCENCE DISPLAY DEVICE AND METHOD OF FABRICATING THE SAME

(75) Inventor: Sung Joon Bae, Seongnam-si (KR)

(73) Assignee: LG.Philips LCD Co., Ltd, Seoul (KR)

( * ) Notice: Subject to any disclaimer, the term of this patent is extended or adjusted under 35 U.S.C. 154(b) by 1 day.

(21) Appl. No.: 10/330,432

(22) Filed: Dec. 30, 2002

(65) Prior Publication Data

US 2003/0218419 A1 Nov. 27, 2003

(30) Foreign Application Priority Data

May 21, 2002 (KR) ...................... 10-2002-0028191

(51) Int. Cl.
*H05B 33/02* (2006.01)

(52) U.S. Cl. ...................... 313/509; 313/504; 313/506; 313/512

(58) Field of Classification Search ................ 313/504, 313/509, 506, 512; 445/24
See application file for complete search history.

(56) References Cited

U.S. PATENT DOCUMENTS

| | | | |
|---|---|---|---|
| 5,848,925 A * | 12/1998 | Howard et al. | 445/24 |
| 6,222,315 B1 * | 4/2001 | Yoshizawa et al. | 313/509 |
| 6,626,722 B1 * | 9/2003 | Takematsu et al. | 445/24 |
| 6,630,785 B1 * | 10/2003 | Lu | 313/505 |
| 6,690,108 B1 * | 2/2004 | Yamaguchi et al. | 313/504 |
| 2001/0045565 A1 * | 11/2001 | Yamazaki | 257/89 |

FOREIGN PATENT DOCUMENTS

JP 2001-230078 8/2001

OTHER PUBLICATIONS

Search Report, Korean Patent Office, May 31, 2004.

* cited by examiner

*Primary Examiner*—Nimeshkumar D. Patel
*Assistant Examiner*—Matt Hodges
(74) *Attorney, Agent, or Firm*—McKenna Long & Aldridge LLP

(57) ABSTRACT

An organic electroluminescence display device include: a substrate where a plurality of red (R), green (G) and blue (B) pixel regions are defined; a plurality of transparent electrodes on the substrate, each transparent electrode disposed in each pixel region; a buffer layer on the substrate in intervals among the transparent electrodes, the buffer layer overlapping side portions of the transparent electrodes; a separator on the buffer layer and arranged on one direction; a hole injection/transporting layer over the substrate covering the plurality of transparent electrodes, the buffer layer and the separator; a luminous layer on the hole injection/transporting layer and divided into each R, G or B pixel region; and a cathode electrode on the hole injection/transporting layer covering the divided luminous layer, the cathode electrode disposed all over the substrate to connect the R, G and B pixel regions.

17 Claims, 4 Drawing Sheets

ORGANIC ELECTROLUMINESCENCE DISPLAY DEVICE AND METHOD OF FABRICATING THE SAME

This application claims the benefit of the Korean Patent Application No. 2002-0028191 filed on May 21, 2002, which are hereby incorporated by reference.

BACKGROUND OF THE INVENTION

1. Field of the Invention

The present invention relates to an electroluminescence display device, and more particularly, to an organic electroluminescence display device and a method of fabricating the same.

2. Discussion of the Related Art

A cathode ray tube has been widely used as a display device such as a television and a computer monitor. However, the cathode ray tube has large size, heavy weight, and high driving voltage. Therefore, flat panel displays having characteristics of being thin, light weight, and low in power consumption have been in demand. The flat panel displays include a liquid crystal display device, a plasma display panel device, a field emission display device, and an electroluminescence display device.

The electroluminescence display device may be categorized into an inorganic electroluminescence display device and an organic electroluminescence display device depending upon a source material for exciting carriers. The organic electroluminescence display device has drawn a considerable attention due to its high brightness, low driving voltage, and natural color images from the entire visible light range. Additionally, the organic electroluminescence display device has a great contrast ratio because of self-luminescence. The organic electroluminescence display device can easily display moving images due to its short response time of several microseconds, and is not limited by a viewing angle. The organic electroluminescence display device is stable at a low temperature, and its driving circuit can be easily fabricated because it is driven by a low voltage. Besides, a manufacturing process of the organic electroluminescence display device is relatively simple.

In general, an organic electroluminescence display device emits light by injecting electrons from a cathode electrode and holes from an anode electrode into an emissive layer, combining the electrons with the holes, generating an exciton, and transitioning the exciton from an excited state to a ground state. Since its luminous mechanism is similar to a light emitting diode, the organic electroluminescence display device may be called an organic light emitting diode (OLED).

FIG. 1 is a schematic cross-sectional view illustrating a related art organic electroluminescent display device. As shown in the related art organic electroluminescent display device, an anode electrode 50 is disposed on a glass substrate 12. A hole injection layer 52, a luminous layer 54 and an electron injection layer 56 are formed in series on the anode electrode 50. A cathode electrode 58 is formed on the electron injection layer 56. Namely, the hole injection layer 52, the luminous layer 54 and the electron injection layer 56 are disposed between the anode electrode 50 and the cathode electrode 58. When the driving voltage is applied to the anode and cathode electrodes 50 and 58, the holes of the hole injection layer 52 and the electrons of the electron injection layer 56 are injected into the luminous layer 54. The injected electrons are combined with the injected holes, thereby producing the electron-hole pairs (the excitons). The electron-hole pair has a lower energy than when it is separated into the electron and the hole. Therefore, an energy gap occurs between the combination and the separation of electron-hole pairs, and this energy is converted into light by the luminous layer 54. That is, the luminous layer absorbs the energy generated due to the recombination of electrons and holes when a current flows.

An organic material for the organic electroluminescent display device is classified into an organic polymer and an organic monomer. Thus, the organic electroluminescent display device is also classified into a polymeric organic electroluminescent display device, a monomeric organic electroluminescent display device, and a mixture thereof. Further, the organic electroluminescent display device can be a combined organic electroluminescent display device that uses both the organic polymer and the organic monomer.

The monomeric organic electroluminescent display device is generally fabricated through a thermal evaporation method that deposits a low molecular substance. Such thermal evaporation method forms unit pixel pattern using a shadow mask. That is, the low molecular substance is thermal-evaporated onto the substrate by passing though pre-patterned openings of the shadow mask. However, the unit pixel becomes smaller in size because the deposition is repeated using the shadow mask to form R/G/B sub-pixels. The shadow mask is not utilized for fabricating the large display device because the shadow mask sags under its own weight and size.

Meanwhile, a high molecular substance is deposited on the substrate using a spin coating method. Since the high molecular substance has a superior impact resistance and makes qualitative and strong thin films as compared to the low molecular substance, it has been used for the organic light emitting diodes. However, when the full-color type organic electroluminescent display device is fabricated using the high molecular substance, the spin coating method is avoided because it produces some disadvantages, such as a high costs of production and a thickness deviation between the central part and the peripheral part of the substrate. Namely, the spin coating method produces a thin film having nonuniform thickness. Therefore, an ink-jet technique is utilized as a new method of forming an organic electroluminescent display device.

FIG. 2 is a schematic cross-sectional view of an organic electroluminescent display device fabricated by an ink-jet technique according to a related art.

In the case of ink jet process, the high molecular substance is simultaneously deposited and patterned, and thus the fabrication process can be conducted relatively in a short time. As shown in FIG. 2, a plurality of first electrodes 50 are formed in pixel regions on a transparent substrate 12. A separator 60 is also formed on the transparent substrate 12 among the first electrodes 50 and overlaps the side portions of the first electrodes 50. Thereafter, hole injection/transporting layers 52 and luminous layers 54 are sequentially formed on the first electrodes 50 by emitting the organic polymer from an ink-jet toner. At this time, each hole injection/transporting layer and each luminous layer 54 are disposed in intervals defined by the separators 60. Further, a second electrode 58 is formed over the whole of the transparent substrate 12, thereby completing the organic electroluminescent display device. However, the above-mentioned process is rather complicating and takes relatively long time because the high molecular substance is respectively deposited in the pixel region.

FIG. 3 is a schematic plan view especially illustrating separators and red (R), green (G) and blue (B) pixels of an organic electroluminescent display device that are fabricated by an ink-jet technique according to a related art. As shown FIGS. 2 and 3, the separator 60 divides the substrate into the lattice-like red (R), green (G) and blue (B) pixels. Since the separator 60 protrudes from the substrate 12 and then makes the step, as shown in FIG. 2, the second electrode 58 is broken and cut when forming the second electrode 58 over the transparent substrate 12.

SUMMARY OF THE INVENTION

Accordingly, the present invention is directed to an organic electroluminescence display device and a method of fabricating the same, which substantially obviates one or more of problems due to limitations and disadvantages of the related art.

An advantage of the present invention is to provide an organic electroluminescent display device that simplifies a fabrication process and increases production yield.

Another advantage of the present invention is to provide an organic electroluminescent display device that has accurate layer patterns and obtains improved characteristics.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, an organic electroluminescence display device include: a substrate where a plurality of red (R), green (G) and blue (B) pixel regions are defined; a plurality of transparent electrodes on the substrate, each transparent electrode disposed in each pixel region; a buffer layer on the substrate in intervals among the transparent electrodes, the buffer layer overlapping side portions of the transparent electrodes; a separator on the buffer layer and extending in one direction; a hole injection/transporting layer formed over the substrate so as to cover the plurality of transparent electrodes, the buffer layer and the separator; a luminous layer formed on the hole injection/transporting layer and divided into each R, G or B pixel region; and a cathode electrode formed on the hole injection/transporting layer to cover the divided luminous layer, the cathode electrode disposed all over the substrate to connect the R, G and B pixel regions.

In another aspect of the present invention, a method of fabricating an organic electroluminescence display device includes: providing a substrate defining a plurality of red (R), green (G) and blue (B) pixel regions on the substrate; forming a plurality of transparent electrodes on the substrate, each transparent electrode disposed in each pixel region; forming a buffer layer on the substrate in intervals among the transparent electrodes, the buffer layer overlapping side portions of the transparent electrodes; forming a separator on the buffer layer, the separator arranged on one direction; forming a hole injection/transporting layer over the substrate to cover the plurality of transparent electrodes, the buffer layer and the separator; forming a luminous layer on the hole injection/transporting layer, the luminous layer divided into each R, G or B pixel region; and forming a cathode electrode on the hole injection/transporting layer to cover the divided luminous layer, the cathode electrode disposed all over the substrate to connect the R, G and B pixel regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used throughout the drawings to refer to the same or like parts.

Figure 4:
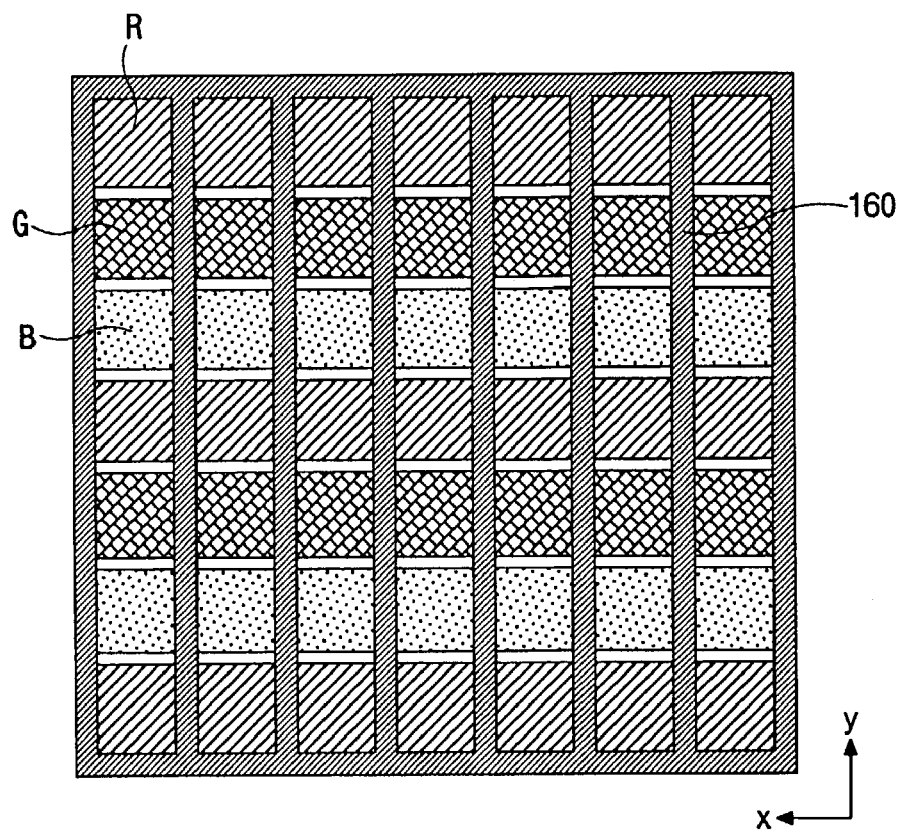
FIG. 4 is a schematic plan view specifically illustrating inventive separators and red (R), green (G) and blue (B) pixels of an organic electroluminescent display device that have been fabricated by an ink-jet technique according to the present invention.
Figure 6:
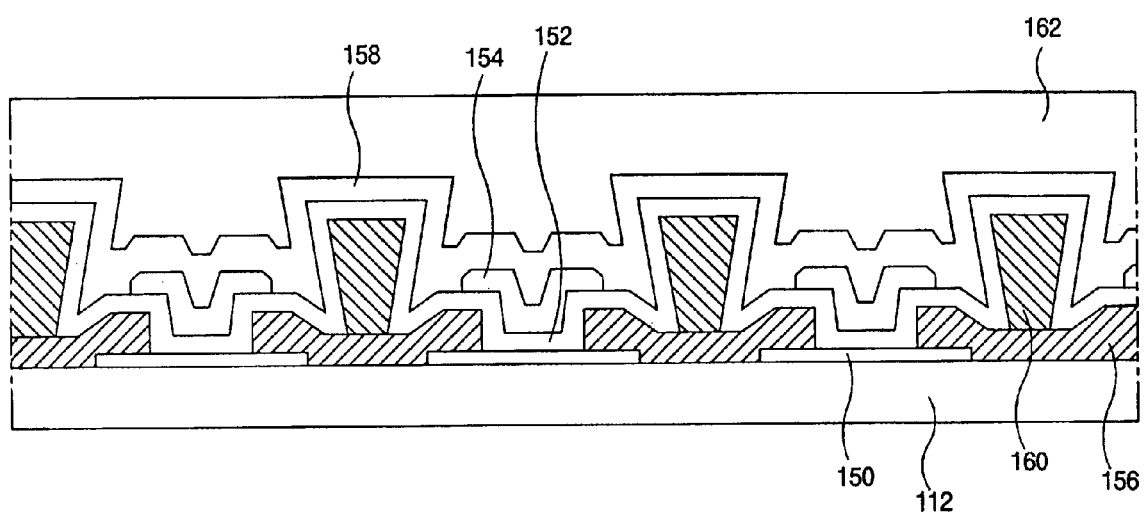
FIG. 6 is a schematic cross-sectional view of an organic electroluminescent display device of FIG. 4 according to the present invention.

FIG. 4 is a schematic plan view illustrating inventive separators and red (R), green (G) and blue (B) pixels of an organic electroluminescent display device that are fabricated by an ink-jet technique according to the present invention, and FIG. 6 is a schematic cross-sectional view of an organic electroluminescent display device of FIG. 4 according to the present invention.

Figure 3:
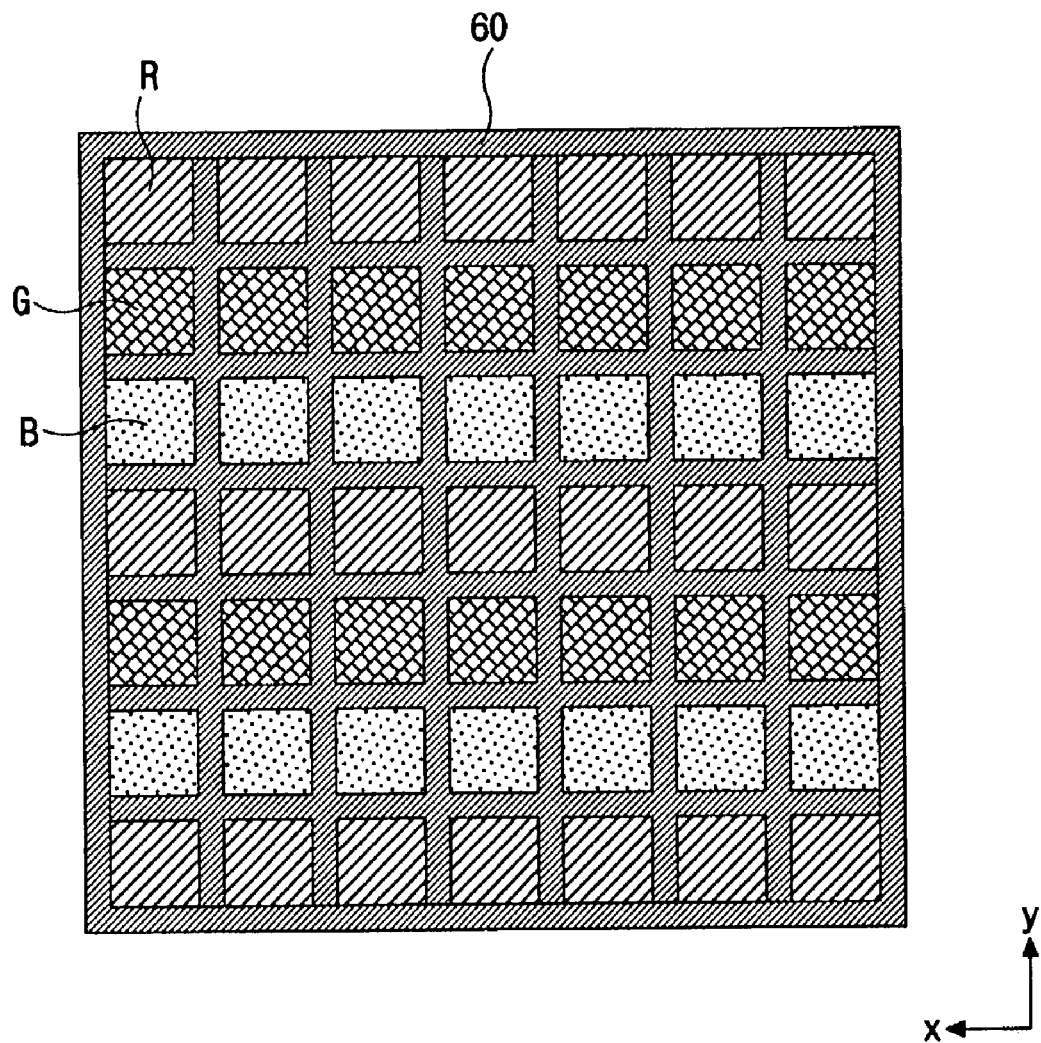
FIG. 3 is a schematic plan view specifically illustrating separators and red (R), green (G) and blue (B) pixels of an organic electroluminescent display device that have been fabricated by an ink-jet technique according to a related art.

As shown in FIGS. 4 and 6, a separator 160 is a line type (i.e., in a y-direction) unlike the related art of FIG. 3 in which the separator 60 has a lattice shape. A hole injection/transporting layer 152 of a high molecular substance is disposed all over a substrate 112. Namely, the hole injection/transporting layer 152 is formed not only in the pixel regions but also on the separator 160. Since the separator 160 is formed in the line type along the y-axis, the breakage and cutting of the second electrode do not occur any more when a second electrode 158 is formed along a direction of y-axis. Further, the high molecular substance for the hole injection/transporting layer 152 is formed along a direction of x-axis using a rolling coating apparatus. Therefore, a process time for forming the high molecular substance layer is shortened.

Figure 5:
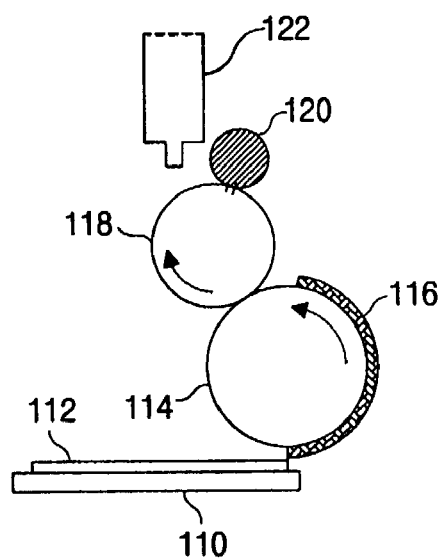
FIG. 5 is a schematic diagram illustrating forming an organic polymer on a substrate using a roll coating apparatus according to the present invention.

FIG. 5 is a schematic diagram illustrating forming an organic polymer on a substrate using a roll coating apparatus according to the present invention.

In FIG. 5, the roll coating apparatus includes a printing table 114, a print roll 114, an anilox roll 118, a doctor roll 120, and a dispenser 122. A substrate 112 for the organic electroluminescent display device is mounted on the printing table 114 that can move up-and-down or right-and-left direction. The print roll 114 is covered with a resin plate 116, the surface of which is embossed in order to form an organic layer in an expected region. The anilox roll 118 is arranged adjacent to the print roll 114, and the doctor roll 120 is arranged adjacent to the anilox roll 118. The dispenser 122 is arranged above the anilox roll 118. While the print roll 114 rotates together with the anilox roll 118, the dispenser emits the high molecular substance to the anilox roll 118, and then this high molecular substance is supplied to the resin plate 116 of the print roll 114. At this time, the doctor roll 120 also rotates to make the emitted high molecular substance have a uniform thickness, and the print roll 114 transfers the emitted high molecular substance from the anilox roll 118 to the substrate 112. Namely, the resin plate 116 having the high molecular substance touches the substrate 112 with respect to the rotation of the print roll 114, and the high molecular substance is coated on the substrate 112 in a shape of the embossing, thereby forming the organic layers (e.g., the hole injection/transporting layer 152 of FIG. 6) on and over the substrate 112.

FIG. 6 is a schematic cross-sectional view of an organic electroluminescent display device of FIG. 4, which is formed by the above-mentioned roll coating apparatus of FIG. 5.

Figure 1:
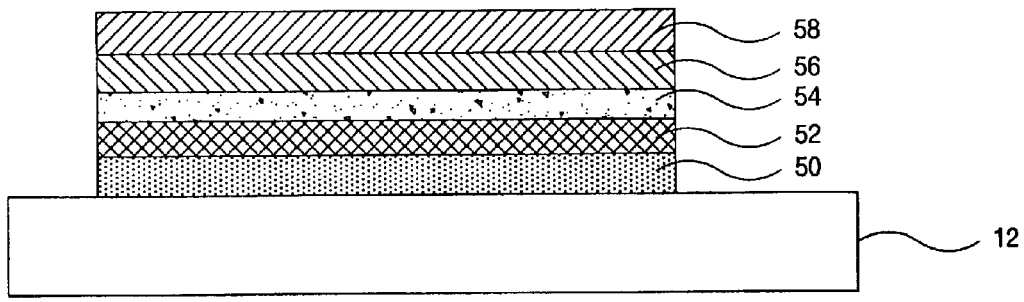
FIG. 1 is a schematic cross-sectional view illustrating a related art organic electroluminescent display device.
Figure 2:
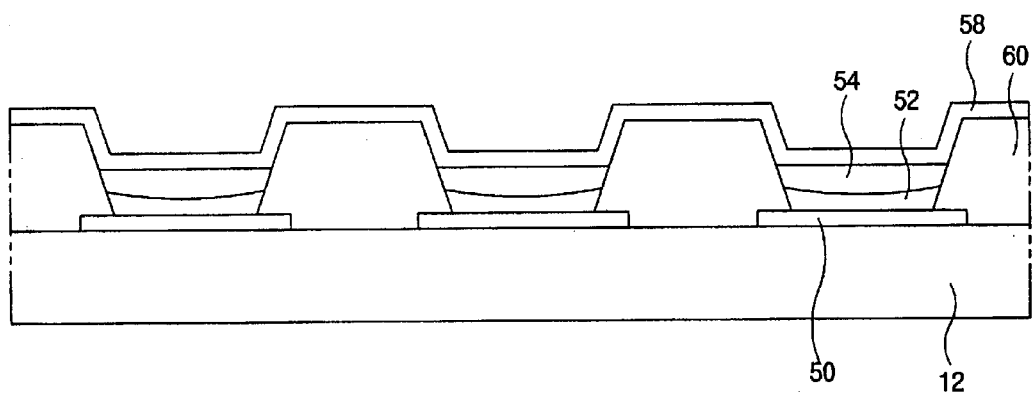
FIG. 2 is a schematic cross-sectional view of an organic electroluminescent display device fabricated by an ink-jet technique according to a related art.

In FIG. 6, a plurality of a transparent anode electrodes 150 are formed on the substrate 112 in the R/G/B pixel regions. A buffer layer 156 is formed on the substrate 112 so as to define the R, G and B pixel regions. Thereafter, the separator 160 is formed on the buffer layer in a line type as shown in FIG. 4. The separator 160 may be made of a liquid-type high molecular substance. Then, a hole injection/transporting layer 152 of a high molecular substance is formed all over the substrate 112 to cover the transparent anode electrode 150, the buffer layer 156 and the separator 160. Unlike the related art shown in FIG. 2, the hole injection/transporting layer 152 is not separated by the R, G and B pixels. The hole injection/transporting layer 152 is formed through a spin coating method or by the roll coating apparatus of FIG. 5. Because the hole injection/transporting layer 152 is not patterned corresponding to each R/G/B pixel, the process time for forming the hole injection/transporting layer 152 can be efficiently shortened, and the fabrication process can be simplified. A luminous layer 154 is formed on the hole injection/transporting layer 152 and then divided corresponding to each R/G/B pixel. Thereafter, a cathode electrode 158 is formed on the hole injection/transporting layer 152 to cover the luminous layer 154. The cathode electrode 158 is all over the substrate 112. A passivation layer 162 is formed on the cathode electrode 162 to protect the underlying layers, thereby completing the organic electroluminescent display device.

In the present invention described hereinbefore, the buffer layer 156 overlaps side portions of the transparent anode electrode 150 and prevents a leakage current. When the hole injection/transporting layer 152 is formed to be wider than the luminous layer 154, the leakage current flowing from the transparent anode electrode 150 to the cathode electrode 158 occurs frequently. Therefore, as a result of simulation testing and experimentation considering the conductive property of the hole injection/transporting layer 152, the buffer layer 156 overlapping the side portions of the transparent anode electrode 150 by a predetermined distance has been determined to prevent the leakage current. The overlapping distance of the buffer layer 156 ranges from about 3 to 10 micrometers (μm) in the present invention. Additionally, the buffer layer 156 is generally an organic insulator, such as silicon oxide ($SiO_2$) or silicon nitride ($SiN_x$). Further, the buffer layer 156 may have a round edge (not shown), instead of an angular edge, in order to improve the adhesion with the high molecular substance (i.e., the hole injection/transporting layer 152).

Meanwhile, the separator 160 has a height ranging from about 5 to 15 micrometers (μm). For example, if the cathode electrode 158 is spaced apart from the transparent anode electrode 152 by a distance of about 1000 angstroms (Å) in each R/G/B pixel region, the height of the separator 160 can be about 10 micrometers (μm) when a solid content of the liquid-like high molecular substance is about 1 wt/v (weight per volume) %, and the height can be about 3 micrometers (μm) when the solid content is about 3 wt/v %.

Accordingly, the line-type separator can prevent the breakage and cutting of the electrode when forming the cathode electrode over the substrate. Further, in the present invention, since the hole injection/transporting layer is formed all over the substrate to connect the pixel regions, the fabrication process can be simplified and the process time can be shortened.

It will be apparent to those skilled in the art that various modifications and variations can be made in the organic electroluminescence display device and the method of fabricating the same of the present invention without departing from the spirit or scope of the inventions. Thus, it is intended that the present invention covers the modifications and variations of this invention provided they come within the scope of the appended claims and their equivalents.

What is claimed is:

1. An organic electroluminescence display device, comprising:
   a substrate where a plurality of red (R), green (G) and blue (B) pixel regions are defined;
   a plurality of transparent electrodes on the substrate, each transparent electrode disposed in each pixel region;
   a buffer layer on the substrate in intervals among the transparent electrodes, the buffer layer overlapping side portions of the transparent electrodes;
   a separator on the buffer layer and extending in one direction, the separator disposed between adjacent pixel regions;
   a hole injection/transporting layer over the substrate and continuously covering the plurality of transparent electrodes, the buffer layer and the separator;
   a luminous layer on the hole injection/transporting layer and divided into each R, G or B pixel region; and
   a cathode electrode on the hole injection/transporting layer covering the divided luminous layer, the cathode electrode disposed all over the substrate to connect the R, G and B pixel regions.

2. The device according to claim 1, wherein the separator is a liquefied high molecular substance.

3. The device according to claim 1, wherein the separator has a height ranging from about 5 to 15 micrometers (μm).

4. The device according to claim 1, wherein the buffer layer is an insulating material.

5. The device of claim 4, wherein the insulating material is one of silicon oxide ($SiO_2$) and silicon nitride ($SiN_x$).

6. The device according to claim 1, wherein the buffer layer overlaps the side portions of the transparent electrode by a distance of about 3 to 10 micrometers (μm).

7. The device according to claim 1, wherein the hole injection/transporting layer includes a high molecular substance.

8. An organic electroluminescence display device, comprising:
    a substrate where a plurality of red (R), green (G) and blue (B) pixel regions are defined;
    a plurality of transparent electrodes on the substrate, each transparent electrode disposed in each pixel region;
    a buffer layer on the substrate in intervals among the transparent electrodes, the buffer layer overlapping side portions of the transparent electrodes;
    a separator on the buffer layer and extending in one direction, wherein the separator is a line type that is patterned along the pixel regions;
    a hole injection/transporting layer over the substrate and continuously covering the plurality of transparent electrodes, the buffer layer and the separator;
    a luminous layer on the hole injection/transporting layer and divided into each R, G or B pixel region; and
    a cathode electrode on the hole injection/transporting layer covering the divided luminous layer, the cathode electrode disposed all over the substrate to connect the R, G and B pixel regions.

9. A method of fabricating an organic electroluminescence display device, comprising:
    providing a substrate defining a plurality of red (R), green (G) and blue (B) pixel regions on the substrate;
    forming a plurality of transparent electrodes on the substrate, each transparent electrode disposed in each pixel region;
    forming a buffer layer on the substrate in intervals among the transparent electrodes, the buffer layer overlapping side portions of the transparent electrodes;
    forming a separator on the buffer layer, the separator arranged on one direction and disposed between adjacent pixel regions;
    forming a hole injection/transporting layer over the substrate to continuously cover the plurality of transparent electrodes, the buffer layer and the separator; forming a luminous layer on the hole injection/transporting layer, the luminous layer divided into each R, G or B pixel region; and
    forming a cathode electrode on the hole injection/transporting layer to cover the divided luminous layer, the cathode electrode disposed all over the substrate to connect the R, G and B pixel regions.

10. The method according to claim 9, wherein forming the hole injection/transporting layer uses a roll coating apparatus.

11. The method according to claim 9, wherein the separator is a liquefied high molecular substance.

12. The method according to claim 9, wherein the separator has a height ranging from about 5 to 15 micrometers (μm).

13. The method according to claim 9, wherein the buffer layer is an insulating material.

14. The method according to claim 13, wherein the insulating material is one of silicon oxide ($SiO_2$) and silicon nitride ($SiN_x$).

15. The method according to claim 9, wherein the buffer layer overlaps the side portions of the transparent electrode by a distance of about 3 to 10 micrometers (μm).

16. The method according to claim 9, wherein the hole injection/transporting layer includes a high molecular substance.

17. A method of fabricating an organic electroluminescence display device, comprising:
    providing a substrate defining a plurality of red (R), green (G) and blue (B) pixel regions on the substrate;
    forming a plurality of transparent electrodes on the substrate, each transparent electrode disposed in each pixel region;
    forming a buffer layer on the substrate in intervals among the transparent electrodes, the buffer layer overlapping side portions of the transparent electrodes;
    forming a separator on the buffer layer, wherein the separator is a line type that is patterned along the pixel regions;
    forming a hole injection/transporting layer over the substrate to continuously cover the plurality of transparent electrodes, the buffer layer and the separator;
    forming a luminous layer on the hole injection/transporting layer, the luminous layer divided into each R, G or B pixel region; and
    forming a cathode electrode on the hole injection/transporting layer to cover the divided luminous layer, the cathode electrode disposed all over the substrate to connect the R, G and B pixel regions.

* * * * *